United States Patent [19]
Misaizu et al.

[11] 4,366,559
[45] Dec. 28, 1982

[54] MEMORY DEVICE

[75] Inventors: Tetsuo Misaizu; Masumi Nakao, both of Tokyo, Japan

[73] Assignee: Nippon Electric Co., Ltd., Tokyo, Japan

[21] Appl. No.: 237,815

[22] Filed: Feb. 24, 1981

Related U.S. Application Data

[63] Continuation of Ser. No. 38,962, May 14, 1979, abandoned.

[30] Foreign Application Priority Data

May 12, 1978 [JP] Japan .................................. 53-56763
May 17, 1978 [JP] Japan .................................. 53-58471

[51] Int. Cl.$^3$ ............................................. G11C 7/06
[52] U.S. Cl. .................................. 365/205; 365/208
[58] Field of Search ...................... 365/205, 207, 208

[56] References Cited

U.S. PATENT DOCUMENTS

| 3,892,984 | 7/1975 | Stein | 365/205 |
| 3,949,381 | 4/1976 | Dennard et al. | 365/205 |
| 4,070,590 | 1/1978 | Ieda et al. | 365/205 |
| 4,160,275 | 7/1979 | Lee et al. | 365/205 |
| 4,233,675 | 11/1980 | Karp et al. | 365/205 |

FOREIGN PATENT DOCUMENTS 54-10023  2/1979  Japan ................................. 365/205

OTHER PUBLICATIONS

Arzubi, Sense Amplifier for Capacitive Storage, IBM Tech. Disc. Bul., vol. 19, No. 2, 7/76, pp. 407–408.
Lee, Cross-Coupled Latch for Memory Sensing, IBM Tech. Dis. Bul., vol. 17, No. 5, 10/74, pp. 1361–1362.

*Primary Examiner*—Stuart N. Hecker
*Attorney, Agent, or Firm*—Sughrue, Mion, Zinn, Macpeak & Seas

[57] ABSTRACT

A memory device which is stable in operation and operable at high speed is disclosed. The memory device comprises a plurality of pairs of digit lines, a plurality of sense amplifiers having a pair of input terminals, a plurality of pairs of gating means and a plurality of memory cells and is characterized in that the pair of input terminals of the sense amplifiers are operatively coupled through the pair of gating means to the pair of digit lines.

24 Claims, 8 Drawing Figures

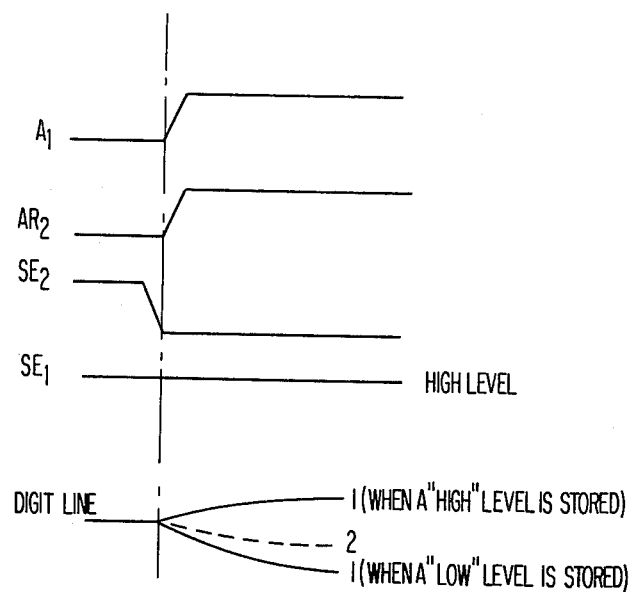

MEMORY DEVICE

This is a continuation of application Ser. No. 38,962, filed May 14, 1979, now abandoned.

BACKGROUND OF THE INVENTION

The present invention relates to a memory device, and more particularly to a semiconductor memory device which is fabricated as a semiconductor integrated circuit.

Semiconductor memory devices have come to have large memory capacities, and the internal signals read-out signals from memory cells are reduced to a minute level. For stably processing the reduced read-out signals and for realizing high-speed operations, a construction of a memory device in which a signal emitted from a memory cell onto a digit line is once amplified by means of a differential amplifier called a "digit sense amplifier" and then transmitted to an external device, is often used. In such memory devices, those employing one-transistor type memory cells having one transistor and one capacitor are generally utilized. Such a memory device is constructed by disposing a memory cell at every cross-point of a matrix formed by a plurality of word lines and a plurality of digit lines each coupled to a sense amplifier. The sense amplifier is provided with a signal read-out from a memory cell via a digit line and amplifies the signal. In recent years, memory capacity has been enlarged and the number of memory cells connected to one digit line has been greatly increased. Consequently, an electrostatic capacitance of the digit line has been inevitably increased. Therefore, a level of an input signal to a sense amplifier is often reduced, resulting in malfunctions of the sense amplifier. For the purpose of compensating for such reduction of the input signal level, it has been necessary to make a sense amplifier highly senstitive and/or to increase an electrostatic capacitance of memory cells themselves for enhancing the level read-out from a selected cell on the digit line. As a result there has been a disadvantage that a chip size is eventually enlarged. In addition, increase in an electrostatic capacitance formed by a digit line in itself results in a delay circuit having a large time-constant, and hence the prior art device also has a disadvantage that a speed of read-out operations is greatly reduced.

Moreover, prior to respective read-out operation, it is necessary to charge digit line up to a predetermined potential to effect the so-called precharge. When a sense amplifier operates to amplify the read-out signal, among the precharged digit lines one having a lower readout signal applied thereto will be discharged to the ground potential. Accordingly, increase in the digit line capacitance would disadvantageously result in increase in dynamic power consumption.

SUMMARY OF THE INVENTION

It is an object of the present invention to provide a memory device in which the load capacitance of a digit line is reduced and thereby the detection sensitivity is increased.

Another object of the present invention is to provide a memory device which can achieve high-speed operation.

According to one feature of the present invention, there is provided a memory device comprising sense amplifiers having first and second input points, a first group of digit lines coupled respectively via gate means to the first input point, and a second group of digit lines coupled respectively via gate means to the second input point, respective one digit lines being selected respectively from the first group of digit lines and from the second group of digit lines.

According to another feature of this invention, there is provided a memory device which comprises a plurality of pairs of digit lines, a plurality of sense amplifiers having a first input terminal and a second input terminal, a plurality of pairs of gating means, a plurality of word lines and a plurality of memory cells arranged at intersections of the digit lines and the word lines wherein the first input terminal and the second input terminal of each of the sense amplifiers are operatively coupled through the pair of gating means to the pair of digit lines.

According to this invention, a plurality of digit lines are connected via respective switching transistors to each one of a pair of input terminals of a digit sense amplifier. Memory cells coupled to the digit lines coupled to the same digit sense amplifier are respectively coupled to different address lines, while reference cells are coupled respectively to at least one digit line for each memory cell. Upon operation of the memory device, a first switching transistor to which a selected memory cell is coupled is made conducting, and second switching transistor corresponding to the first switching transistor is made conducting so that a selected reference cell may be coupled to the other input terminal of the sense amplifier to which the switching transistor is coupled.

In this way, a number of memory cells coupled to one digit line is reduced, so that the capacitance of the digit line is reduced resulting in a large capacitance ratio of a capacitor included in a memory cell to a digit line and an area of a memory cell is small. Further, the number of digit sense amplifiers need not be increased. In other words, a memory device which is stable in operation and is suitable for high speed operation, low power consumption and high yield, can be obtained.

BRIEF DESCRIPTION OF THE DRAWINGS

Other features and advantages of the present invention will become apparent upon a perusal of the following specification taken in connection with the accompanying drawings wherein:

FIG. 8 is a waveform diagram for the operations of the memory device in FIG. 7.

DETAILED DESCRIPTION OF THE INVENTION

Figure 1:
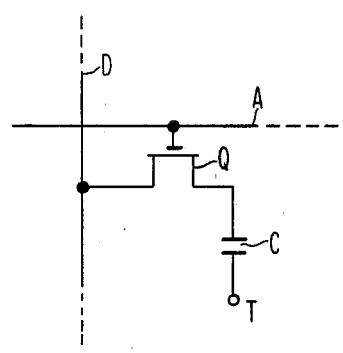
FIG. 1 is a circuit diagram showing an one-transistor memory cell.

Referring now to FIG. 1 of the drawings, a memory cell of one-transistor type is illustrated, in which one end of a capacitor element C for holding logical information as a potential is coupled to a terminal T to which a constant potential is applied, and the other end of the capacitive element C is coupled via a source-drain path of a switching MOS transistor Q to a digit line D. Read-out and write-in of logical information is effected between the capacitor element C and the digit line D through this transistor Q. To the gate of the transistor Q is connected a word line A.

Figure 2:
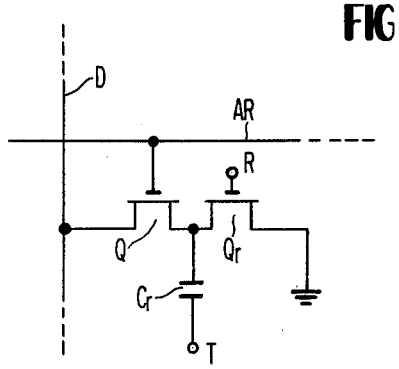
FIG. 2 is a circuit diagram showing a reference cell.

FIG. 2 shows a reference cell for applying a reference potential to a digit sense amplifier. A capacitive element Cr of a reference cell has a smaller capacitance than that of the capacitive element C of the memory cell, in which one end of the capacitor Cr is coupled to a fixed potential terminal T and the other end is connected to both a reset transistor Qr and the switching transistor Q. The other end of the transistor Q is coupled to a digit line and the gate of the transistor Q is coupled to a reference word line AR. The other end of Qr and the gate of Qr are grounded and coupled to a terminal R, respectively.

Figure 3:
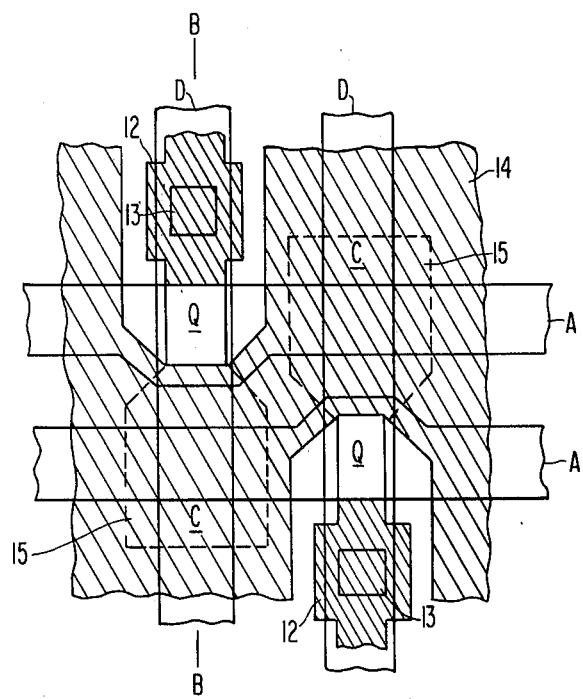
FIG. 3 is a plan view of a pattern of a semiconductor device employing the one-transistor memory cell in FIG. 1.
Figure 4:
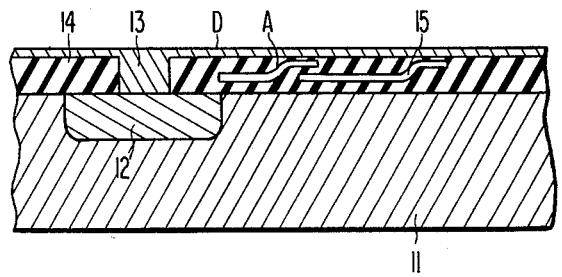
FIG. 4 is a cross-sectional view taken along line B—B in FIG. 3.

With regard to a structure of a memory cell, for instance, as shown in FIGS. 3 and 4, an N-type diffusion layer 12 as a drain of a switching transistor is formed in a P-type semiconductor substrate 11, and the diffusion layer 12 is connected via a contact portion 13 to a metallic wiring layer D as a digit line. Adjacent to the diffusion layer 12, within an insulator layer 14 is formed an address line A of a polycrystalline silicon layer. Adjacent to this word line A, within the same insulator layer 14 is formed one electrode 15 of a capacitor element C in a memory cell, which electrode consists of a polycrystalline silicon layer.

Figure 5:
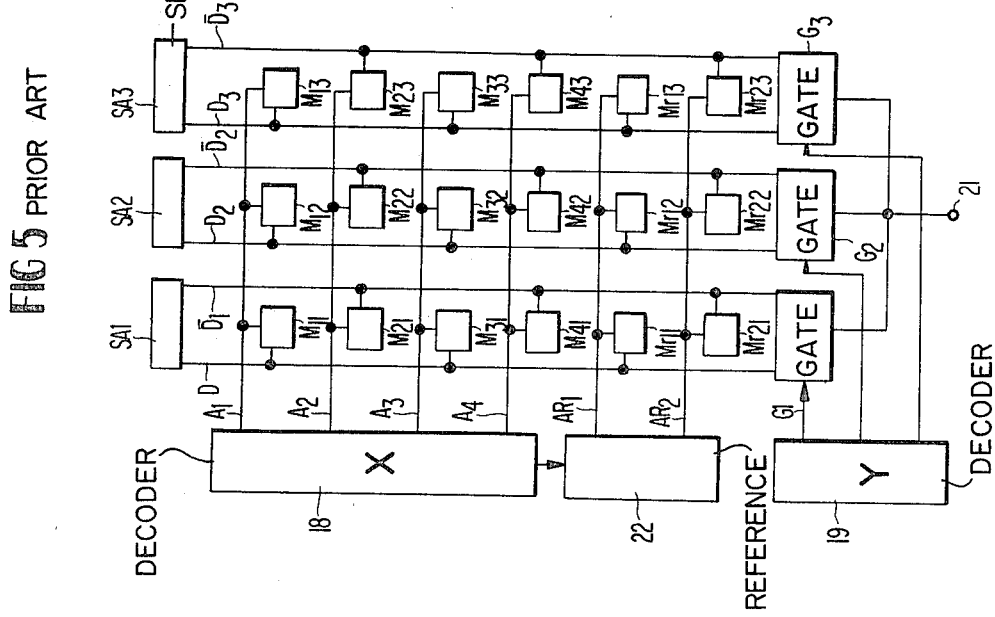
FIG. 5 is a schematic block diagram showing a memory cell matrix consisting of a plurality of one-transistor memory cells in the prior art.

In a general memory matrix, as shown in FIG. 5, memory cells M11 to M43 such as shown, for example, in FIG. 1 are arrayed in four rows by three columns, and digit line pairs D1 and $\overline{D1}$, D2 and $\overline{D2}$, and D3 and $\overline{D3}$ are provided for the respective columns. The memory cells in each column are coupled to one or the other digit line in respective digit line pairs depending upon whether the memory cell is located in an odd numbered row or an even numbered row. The memory cells are coupled to respective word lines A1 to A4 corresponding to the rows in which they are respectively located. To the digit lines $\overline{D1}$, $\overline{D2}$ and $\overline{D3}$ are coupled reference cells $Mr_{11}$, $Mr_{12}$ and $Mr_{13}$, respectively, and these reference cells are coupled to a reference word line AR1 in common. On the other hand, to the digit lines $\overline{D1}$, $\overline{D2}$ and $\overline{D3}$ are coupled reference cells $Mr_{21}$, $Mr_{22}$ and $Mr_{23}$, respectively, and these reference cells are coupled to a reference word line AR2 in common. An output of an X-decoder 18 provides an output signal to one of the word lines A1 to A4, while an output of a Y-decoder 19 opens one of gate circuits G1, G2 and G3 to couple any one of the digit line pairs D1' $\overline{D1}$, D2 $\overline{D2}$, and D3 $\overline{D3}$ to an external connection terminal 21. Between the respective pairs of digits D1 $\overline{D1}$, D2 $\overline{D2}$ and D3 $\overline{D3}$ are respectively coupled sense amplifiers SA1, SA2 and SA3.

When an output signal of the X-decoder 18 is applied to a word line A, the electric charges stored in the row of memory cells coupled to that word line A are respectively discharged onto the digit lines to which the respective memory cells are coupled, and thereby the potentials on these digit lines are changed according to the information stored in the corresponding memory cell. In addition, depending upon the decoded results of the X-decoder 18, an output signal is provided from the reference decoder 22 to either one of the reference word lines AR1 and AR2. Then, the output signal from the reference decoder 22 appears on the reference word line coupled via a reference cell to the digit line in each digit line pair other than the digit line coupled via the selected memory cell to the word line on which the output signal from the X-decoder 18 appears. In this way, a reference potential is applied from the reference cell to the digit line of the digit line pair to which the readout potential is not applied. The read-out potentials and the reference potentials are applied to the sense amplifiers SA1, SA2 and SA3, respectively. These sense amplifiers are, for instance, composed of a flip-flop circuits or a differential amplifier in which the read-out potential is compared with the reference potential to take a state corresponding to the result of comparison and thus causing the digit line potential to take a state corresponding to the result of comparison and thus the digit line potential is varied as the amplified output potential. Accordingly, the information in the read-out memory cell which was once destroyed upon read-out operation, can be again written-in the same memory cell. In response to the address applied to the Y-decoder 19, one of the gate circuits G1, G2 and G3 opens to electrically couple the selected digit line to the terminal 21, so that read-out operations from the digit line to the terminal 21 or write-in operations from the terminal 21 to the digit line may be achieved. The rewriting into the memory cells by means of the sense amplifiers SA1 to SA3 is called "refresh".

In a one-transistor type memory, logical information is stored in the form of a potential on a capacitor element C in a memory cell, that is, a charge stored in this capacitor element C. Due to a leakage current to a substrate, the charge stored in the capacitor element C is lost as time elapses. Therefore, it is necessary to refresh every memory cell at a given constant time interval, for instance, every two milliseconds. In the memory cell array shown in FIG. 5, since one row of memory cells are refreshed at a time, in order to refresh all the memory cells, all the row address lines must be selected successively, and the number of cycles to be repeated until all the memory cells have been refreshed is equal to the number of row address lines, i.e word lines. These cycles are called refresh cycles. In the memory construction shown in FIG. 5, the refresh cycle is four cycles, and normally in a 16-K bit memory, the refresh cycle involves 128 cycles.

If the capacitance of a capacitor C in a memory cell (hereinafter called simply a capacitance of a memory cell) is represented by $C_S$, while the intire parasitic capacitance of a digit line D upon read-out operation is represented by Cd, then a net input signal value received by a sense amplifier upon read-out operation is a difference between the read-out potential from the memory cell and the reference potential, and this input signal value is approximately proportional to the ratio of the memory cell capacit $C_S$ to the digit line capacitance Cd, that is, the ratio $C_S$/Cd.

As this input signal becomes larger, the operation of the digit sense amplifier become more stable and the amplification operation becomes faster. At present, the circuit operations speed has increased and the proportion of an access time occupied by the operation of the digit sense amplifier is increasing. Accordingly, speeding up the digit sense amplifier would result in a time savings of the entire circuit. Therefore it is preferable to select a smaller digit line capacitance Cd and a larger memory cell capacitance $C_S$.

Considering in aspect of power consumption, prior to read-out operation through a digit line, it is necessary to charge the digit line to a predetermined potential, that is to effect precharge. When a digit sense amplifier operates to perform amplification of a read-out signal, among the precharged digit lines, a digit line on which a lower potential read-out signal appears would be discharged to the ground. Accordingly, if the digit line capacitance Cd is large, then power consumption is increased. In other words, the digit line capacitance Cd should be preferably small.

Discussing from the view point of enhancement of yield as well as increase of memory capacity in bits, in order to increase a memory cell capacitance $C_S$, unless a manufacturing condition is modified, the area of the electrode 15 of the capacitor element C in FIG. 3 must be increased, which results in a large memory cell area, and since the chip size is increased, the increase of the memory cell capacitance $C_S$ acts contrary to the enhancement of yield as well as increase of memory capacity.

As will be appreciated from FIGS. 3 and 4, the digit line capacitance Cd includes a capacitance formed between a diffusion layer 12 serving as a drain of a switching transistor Q in a memory cell and a substrate 11, a capacitance formed between a metallic wiring serving as a digit line D and the layer A of polycrystalline silicon serving as the word line and a capacitance formed between the layer 15 of polycrystalline silicon serving as an electrode of capacitor element C and the digit line D, and these capacitances produce the predominant part of the digit line capacitance Cd. Especially in the case where the number of refresh cycles is increased, in the conventional memory construction in which a pair of digit lines are coupled to one sense amplifier as shown in FIG. 5, as a number of memory cells are coupled to one digit line is increased, the digit line capacitance is increased accordingly. For instance, in the case of 128 refresh cycles, 64 memory cells are coupled to one digit line. In the conventional memory construction, if the digit line capacitance Cd is reduced by decreasing the number of memory cells coupled to each digit line, then the number of digit lines is consequently increased. If such modification is made, the number of digit sense amplifiers is also increased. As digit sense amplifiers occupy a large area next to memory cells within a semiconductor chip, the increase of the number of digit sense amplifiers would result in increase of a chip area.

As described above, in the heretofore known semiconductor memory devices, further improvements in circuit stability, high speed operation and yield, as well as realization of low power consumption, have been inevitably limited.

One preferred embodiment of the present invention will be described with reference to FIG. 6, in which component parts equivalent to those shown in FIG. 5 are designated by like reference characters. To each one of two input terminals of each sense amplifier $SA_1$, $SA_2$ or $SA_3$ are coupled a plurality of digit lines via switching transistors $S(S_i, S_i', \overline{S}_i, \overline{S}_i' : i=1,2,3)$. For instance, to one input terminal of the sense amplifier $SA_1$ are coupled digit lines $D_1$ and $D_1'$ via switching transistors $S_1$ and $S_1'$, respectively, and to the other input terminal are coupled digit lines $\overline{D}_1$ and $\overline{D}_1'$ via switching transistors $\overline{S}_1$ and $\overline{S}_1'$. While the information read-out at the external connection terminal 21 from the memory cells coupled to one input terminal of a sense amplifier have an opposite polarity to those from the memory cells coupled to the other input terminal of the same sense amplifier, upon write-in operations to the memory cells, the signals applied to the respective memory cells have reverse polarities depending upon the input terminal of the sense amplifier to which the memory cells are coupled, and hence the illustrated memory device can be treated similarly to a known memory device.

Figure 6:
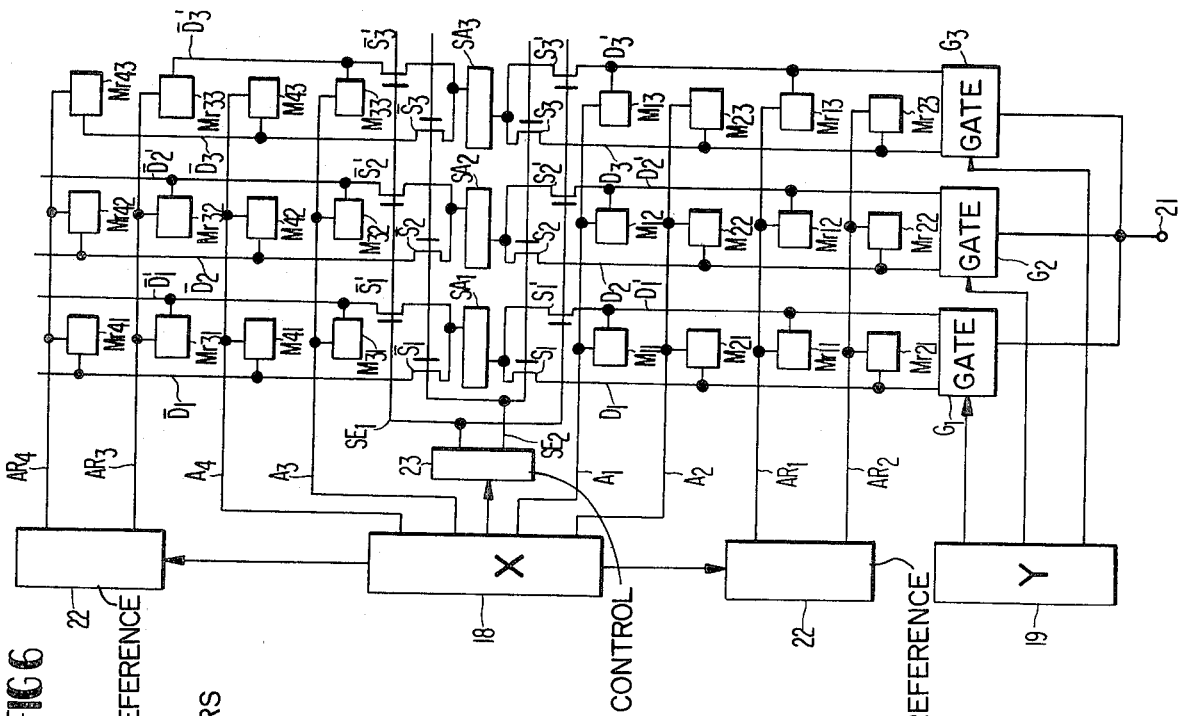
FIG. 6 is a block diagram showing a first preferred embodiment of the semiconductor memory device according to the present invention.

In the case of the memory cell matrix shown in FIG. 6, the refresh cycles consist of four cycles but the number of memory cells coupled to one digit line is two, which is one half of the number of memory cells per one digit line in the case of a memory cell matrix of the same type as that shown in FIG. 5 and having the same refresh cycles. Accordingly, in the event that the number of refresh cycles is increased such that, for example, 64-K bit memory involves 256 cycles, the digit line capacitance Cd can be reduced by a factor of $\frac{1}{2}$ as compared to the heretofore known memory construction, because contribution of reference cells and switching transistors to the digit line capacitance is negligible.

As described above, in the semiconductor memory device according to the present invention, the digit line capacitance can be reduced in comparison to the conventional memory construction in the prior art in which two digit lines are coupled to each digit sense amplifier. Therefore, it is possible to reduce the digit line capacitance Cd and thus improve the ratio Cs/Cd of the memory cell capacitance to the digit line capacitance without enlarging each memory cell nor increasing the number of the digit sense amplifiers.

With further reference to FIG. 6, the gates of one transistors $S_1'$, $S_2'$ and $S_3'$ of the respective switching transistor pairs coupled to one input terminals of the respective sense amplifiers and the gates of one transistors $\overline{S}_1'$, $\overline{S}_2'$ and $\overline{S}_3'$ of the respective switching transistor pairs coupled to the other input terminals are coupled to one common digit selection line $SE_1$, and the gates of the remaining switching transistors $S_1$, $S_2$, $S_3$, $\overline{S}_1$, $\overline{S}_2$ and $\overline{S}_3$ are coupled to the other common digit selection line $SE_2$. An input address to the X-decoder 18 or a decoded signal therefrom is fed to reference decoders 22 and digit selection line control circuit 23. The reference decoders 22 and digit selection line control circuit 23 respond to the decoded information fed from the X-decoder 18 for connecting one input terminal of the sense amplifiers to digit lines coupled via memory cells to a selected word line and for connecting the other input terminals of the sense amplifiers to digit lines coupled via reference cells to the selected reference word line.

For instance, in the case where a word line $A_1$ has been selected by the X-decoder 18, then the reference word line $AR_3$ is selected by the reference decoder 22. Accordingly, the stored information in the memory cells $M_{11}$, $M_{12}$ and $M_{13}$ are read-out on the digit lines $D_1'$, $D_2'$ and $D_3'$, respectively, while to the digit lines $\overline{D}_1'$, $\overline{D}_2'$ and $\overline{D}_3'$ are applied the respective reference potentials stored in the reference cells $Mr_{31}$, $Mr_{32}$ and $Mr_{33}$ respectively. At this time, in response to an output signal on the digit selection line $SE_1$ issued from the digit selection line control circuit 23, the switching transistors $S_1'$, $S_2'$, $S_3'$, $\overline{S}_1'$, $\overline{S}_2'$ and $\overline{S}_3'$ are turned to a conducting state. Accordingly, the information potentials on the digit lines $D_1'$, $D_2'$ and $D_3'$ and the reference potentials on the digit lines $\overline{D}_1'$, $\overline{D}_2'$ and $\overline{D}_3'$ are respectively delivered to sense amplifiers $SA_1$, $SA_2$, $SA_3$.

While the present invention has been described above as applied to an one-transistor type memory, obviously the same effects and advantages can be obtained with respect to different types of semiconductor memory devices which employ digit sense amplifiers because of reduced signalling requirements of each memory cell.

In any event, the same effects and advantages can be realized by controlling the digit selection line control circuit 23 with an address input signal so that upon read-out operation only the digit lines which are applied with a read-out potential and a reference potential, respectively, from a memory cell and reference cell coupled to selected word lines may be coupled to the digit sense amplifier under the control of a digit selection line $SE_1$ or $SE_2$.

As described above, according to the present invention, in a one-transistor type memory device, each digit line is coupled to a digit sense amplifier through a source-drain path of a switching transistor, memory cells coupled to the digit lines which are coupled to the same digit sense amplifier are coupled to different word lines, and upon read-out operation from the memory cells, the digit selection lines $SE_1$ and $SE_2$ for controlling the states of the above-mentioned switching transistors are controlled by an externally applied address input signal so that only the digit lines applied with a read-out potential and a reference potential, respectively, may be coupled to the digit sense amplifier. In this way, a one-transistor type memory device having a small digit line capacitance, a large capacitance ratio of the memory cell to the digit line and a small memory cell area, and which is stable in operation and suitable for high speed operation, yet have low power consumption and high yield production, can be realized.

The number of digit lines coupled to the same input terminal of the digit sense amplifier via switching transistors is not limited to two, but it could be further increased. The reference cells could be coupled to at least one of the digit lines which are coupled to one input terminal of each sense amplifier and also to at least one of the digit lines which are coupled to the other input terminal. In the event that a reference cell is coupled to every digit line as shown in FIG. 6, then whatever memory cell may be selected, the number of cells coupled at that time to one sense amplifier is always identical, and hence a memory device operable in a stable manner can be obtained. If such provision is made, the number of reference cells will be somewhat increased, but this increase is small compared to the entire number of memory cells, and therefore, as a whole of the memory device, the chip area is not significantly enlarged.

A second preferred embodiment of the present invention will be described with reference to FIGS. 7 and 8. In the illustrated embodiment, for the sake of simplicity, an X-address has a 3-bit construction consisting of $X_0$, $X_1$ and $X_2$. In addition, circuit portions which are unnecessary for description of the present invention are omitted. A sense amplifier circuit $SA_1$ is composed of cross-coupled MOS transistors $QA_1$ and $QB_1$. Similarly, a sense amplifier circuit $SA_2$ is composed of MOS transistors $QA_2$ and $QB_2$. In the sense amplifier circuit $SA_1$, to the gate of MOS transistor $QA_1$ is coupled via a source-drain path of a MOS transistor $S_1$ to digit line $D_1$ which is coupled to one-transistor type memory cells $M_{11}$ and $M_{31}$ and a reference cell $Mr_{11}$. Also, a digit line $\overline{D}_1$ which is coupled to memory cells $M_{21}$ and $M_{41}$ and a reference cell $Mr_{21}$, is coupled via a source-drain path of a MOS transistor $\overline{S}_1$ to the gate of the MOS transistor $QB_1$ in the sense amplifier circuit $SA_1$. Likewise, a digit line $\overline{D}_2$ coupled to memory cells $M_{51}$ and $M_{71}$ and a reference cell $Mr_{31}$, and a digit line $D_2$ coupled to memory cells $M_{61}$ and $M_{81}$ and a reference cell $Mr_{41}$ are respectively coupled to the gates of the MOS transistors $QB_1$ and $QA_1$, respectively, in the sense amplifier circuit $SA_1$ via MOS transistors $S_1'$ and $\overline{S}_1'$, respectively. To the gates of the MOS transistors $S_1$ and $\overline{S}_1$ is applied a digit selection signal $SF_1$ obtained by passing an address $X_2$ through a buffer circuit 123, and to the gates of the MOS transistors $S_1'$ and $\overline{S}_1'$ is applied a digit selection signal $SE_2$ obtained by passing an address $\overline{X}_2$ through a buffer circuit 123'. Word address output signals $A_1$ to $A_4$ from an X-decoder 118 are respectively applied to word terminals of the memory cells $M_{11}$, $M_{21}$, $M_{31}$ and $M_{41}$, while address signals $\overline{X}_0$ and $X_0$ are respectively passed through buffer circuits $\overline{122}$ and 122 and the output signals $AR_1$ and $AR_2$ as reference word signals are applied to word terminals of the reference cells $Mr_{11}$ and $Mr_{21}$, respectively. Likewise, word address output signals $A_5$ to $A_8$ from an X-decoder 118' are respectively applied to word terminals of the memory cells $M_{51}$, $M_{61}$, $M_{71}$ and $M_{81}$, while address signals $\overline{X}_0$ and $X_0$ are respectively passed through buffer circuits $\overline{122}'$ and 122' and the output signals $AR_3$ and $AR_4$ as reference word signals are applied to word terminals of the reference cells $Mr_{31}$ and $Mr_{41}$. The complementary output signals from the sense amplifier are fed to complementary read bus lines $B_1$ and $B_2$ by selectively turning on one of transistor pairs $(Q_{11}, Q_{12})$, $(Q_{13}, Q_{14})$, $(Q_{15}, Q_{16})$, $(Q_{17}, Q_{18})$ which form Y-selection gates in response to decoded output signals $d_1$ to $d_4$ from Y-decoders 119 and 119' receiving Y-address $Y_1$ and $Y_2$. The read-out output signals transmitted through the read bus lines $B_1$ and $B_2$ are amplified by a main sense amplifier MSA and are externally delivered as true and complementary outputs $D_{out}$ and $\overline{D}_{out}$.

Figure 7:
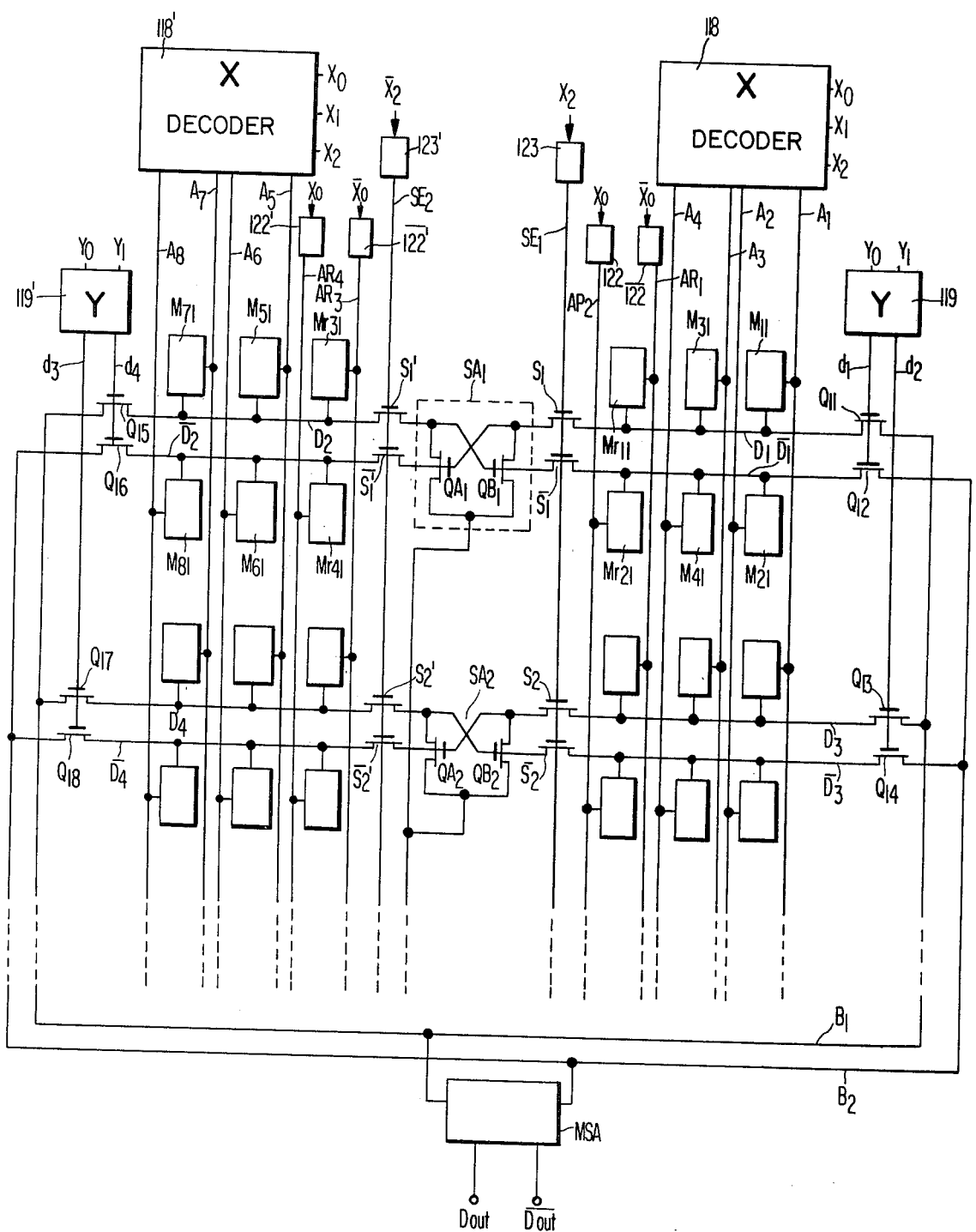
FIG. 7 is a block diagram showing a second preferred embodiment of the semiconductor memory device according to the present invention.

In the memory circuit shown in FIG. 7, when the address line $A_1$ is selected, the signal $SE_2$ changes from a "high" level to a "low" level before a selection signal voltage is applied to the address line $A_1$ as shown in FIG. 8, and thereby the MOS transistors $S_1'$ and $\overline{S}_1'$ are turned off, whereas the signal $SE_1$ maintains a "high" level, and hence the MOS transistors $S_1$ and $S_1$ are held on. As a result, the digit lines $D_2$ and $\overline{D}_2$ are electrically disconnected from the MOS sense amplifier $SA_1$, while the digit lines $D_1$ and $\overline{D}_1$ are coupled to the MOS sense amplifier $SA_1$. When a signal voltage has been applied to the word line $A_1$ if the memory cell $M_{11}$ is at a "high" level, a high differential output is delivered to the digit line $D_1$ but if it is at a "low" level, a low differential output is delivered. At this moment, a reference word line $AR_2$ has been selected, and thereby an intermediate differential output between the high differential output and the low differential output is delivered to the digit line $\overline{D}_1$. The sense amplifier circuit $SA_1$ operates in response to a signal difference between the digit lines $D_1$ and $\overline{D}_1$. In the case where the MOS transistors $S_1'$ and $\overline{S}_1'$ become conducting, read-out operation is effected after a similar addressing operation.

It is to be noted that the present invention should not be limited to the above-described preferred embodiments, but it is equally applicable to any arbitrary type of sense amplifiers, memory cells, and the like.

We claim:

1. A semiconductor memory device comprising a sense amplifier having a first input terminal and a second input terminal, a first digit line arranged on a first side of said sense amplifier, a second digit line arranged in parallel with and adjacent to said first digit line, a third digit line arranged on a second and opposite side of said sense amplifier, a fourth digit line arranged in parallel with and adjacent to said third digit line, a first group of memory cells coupled to said first digit line, a second group of memory cells coupled to said second digit line, a third group of memory cells coupled to said third digit line, a fourth group of memory cells coupled to said fourth digit line, a first means for selectively connecting said first digit line to said first input terminal, second means for selectively connecting said second digit line to said first input terminal, third means for selectively connecting said third digit line to said second input terminal, fourth means for selectively connecting said fourth digit line to said second input terminal, first control means for enabling one of said first and second means to connect a selected one of said first and second digit lines to said first input terminal and second control means for enabling one of said third and fourth means to connect a selected one of said third and fourth digit lines to said second input terminal.

2. The memory device according to claim 1, in which said first group of memory cells and said second group of memory cells are alternatingly arranged in the same direction at intervals, and said third group of memory cells and said fourth group of memory cells are alternatingly arranged in the same direction at intervals.

3. The device according to claim 1, in which said first group of memory cells and said second group of memory cells are arranged in parallel to each other respectively along said first digit line and said second digit line, and said third group of memory cells and said fourth group of memory cells are arranged in parallel to each other respectively along said third digit line and said fourth digit line.

4. The device according to claim 1, further comprising means for receiving address signals, in which said first and second control means are controlled based on at least part of said address signals.

5. A semiconductor memory device comprising a sense amplifier having a first input terminal and a second input terminal, a first digit line arranged on a first side of said sense amplifier, a first group of memory cells coupled to said first digit line, a second digit line arranged on a second side of said sense amplifier, a second group of memory cells coupled to said second digit line, said first side and said second side having a symmetrical relation with respect to said sense amplifier, a third digit line arranged on said first side in parallel with and adjacent to said first digit line, a third group of memory cells coupled to said third digit line, a fourth digit line arranged on said second side in parallel with and adjacent to said second digit line, a fourth group of memory cells coupled to said fourth digit line, first means for selectively connecting said first digit line to said first input terminal, second means for selectively connecting said second digit line to second input terminal, third means for selectively connecting said third digit line to said first input terminal, fourth means for selectively connecting said fourth digit line to second input terminal, a first control line coupled to said first and third means in common, a second control line coupled to said second and fourth means, and control means for selectively energizing one of said first and second control lines.

6. The device according to claim 5, in which said first group of memory cells and said third group of memory cells are alternatingly arranged at intervals and said second group of memory cells and said fourth group of memory cells are alternatingly arranged at intervals.

7. The memory device according to claim 5, in which said first group of memory cells and said third group of memory cells are arranged in parallel to each other, and said second group of memory cells and said fourth group of memory cells are arranged in parallel to each other.

8. The device according to claim 5, further comprising means for receiving address information, in which said control means is responsive to said address information.

9. The device according to claim 5, further comprising a first common line, a second common line, first switching means for selectively connecting said first common line to said first digit line, second switching means for selectively connecting said first common line to said second digit line, third switching means for selectively connecting said second common line to said third digit line and fourth switching means for selectively connecting said second common line to said fourth digit line.

10. The device according to claim 9, further comprising an output amplifier having a first input point and a second input point, means for connecting said first input point to said first common line, and means for connecting said second input point to said second common line.

11. The memory device according to claim 1 or 5, further comprising an output amplifier having at least one input terminal and a transfer gate for selectively connecting said input terminal of said output amplifier to either of said first and second input terminals.

12. The device according to claim 1 or 5, in which each of said first, second, third and fourth means includes an insulated-gate field-effect transistor.

13. The device according to claim 1 or 5, further comprising a first bus line, a second bus line, first gate means for selectively connecting said first bus line to said first digit line and second gate means for selectively connecting said second bus line to said second input terminal.

14. The device according to claim 13, further comprising an output amplifier having a first input point and a second input point, first connection means for connecting said first input point to said first bus line and second connection means for connecting said second input point to said second bus line.

15. A semiconductor memory device comprising a sense amplifier having a first input terminal and a second input terminal, a first digit line arranged on a first side of said sense amplifier, a second digit line arranged on said first side and in parallel to said first digit line, a third digit line arranged on a second and opposite side of said sense amplifier, a fourth digit line arranged on said second side and in parallel to said third digit line, a first group of memory cells coupled to said first digit line, a second group of memory cells coupled to said second digit line, a third group of memory cells coupled to said third digit line, a fourth group of memory cells coupled to said fourth digit line, a first switching gate coupled between said first digit line and said first input terminal and arranged on said first side, a second switching gate coupled between said second digit line and said second input terminal and arranged on said first side, a third switching gate coupled between said third digit line and said first input terminal and arranged on said second side, a fourth switching gate coupled between said fourth digit line and said second input terminal and arranged on said second side, a first control line at least on said first side, said first control line having electrical connection to said first and second switching gates, a second control line at least on said second side, said second control line having electrical connection to said third and fourth switching gates, and means responsive to address information for selectively supplying one of said first and second control lines with a selection signal.

16. The device according to claim 15, further comprising an output amplifier having a first input terminal and a second input terminal, a first common line, a second common line, first means for connecting said first common line to said first input terminal of said output amplifier, second means for connecting said second common line to said second input terminal of said output amplifier, a first digit gate for selectively connecting said first digit line to said first common line, a second digit gate for selectively connecting said second digit line to said second common line, a third digit gate for selectively connecting said third digit line to said first common line, and a fourth digit gate for selectively connecting said fourth digit line to said second common line.

17. The device according to claim 16, in which said first digit gate and said second digit gate are arranged on a first side of said first and second digit lines, respectively, and said first and second switching gates are arranged on a side of said first and second digit lines opposite said first side, and said third and fourth digit gates are arranged on a first side of said third and fourth digit lines, respectively, and said third and fourth switching gates are arranged on a side of said third and fourth digit lines opposite said first side.

18. The device according to claim 15, in which each of said memory cells includes a capacitor and a transistor coupled between associated one of said digit lines and said capacitor.

19. The device according to claim 18, in which said sense amplifier includes first and second transistors cross-coupled at said first and second input terminals of said amplifier.

20. The device according to claim 15, in which said first digit line is adjacent to said second digit line and said third digit line is adjacent to said fourth digit line.

21. A memory device comprising a plurality of sense amplifiers arranged in row direction, each of said sense amplifiers having a pair of input terminals, a plurality of first digit line pairs, each of said first digit line pairs being arranged on a first side of associated one of said sense amplifiers and in a column direction, a plurality of second digit line pairs, each of said second digit line pairs being arranged on a second side of associated one of said sense amplifiers and in the column direction, a plurality of memory cells coupled to the respective digit lines, a plurality of first transfer gate pairs arranged in a first row adjacent to a first side of the row of said sense amplifiers, each of said first transfer gate pairs operatively connecting each of said first digit line pairs to the pair of input terminals of associated one of said sense amplifiers, a plurality of second transfer gate pairs arranged in a second side of said row of said sense amplifiers opposite to said first side with respect to said sense amplifiers, each of said second transfer gate pairs operatively connecting each of said second digit line pairs to the pair of input terminals of associated one of said sense amplifiers, a first control line arranged along the rows of said first transfer gate pairs, said first control line having electrical connection to said first transfer gate pairs, a second control line arranged along the rows of said second transfer gate pairs and electrically connected to said second transfer gates, and means selectively energizing one of said first and second control lines, whereby said plurality of sense amplifiers are utilized for either of said first and second digit line pairs.

22. The device according to claim 21, further comprising a pair of bus lines, an output amplifier having a pair of input terminals, means for connecting said pair of input terminals of said output amplifier to said pair of bus lines, a plurality of first column selection gate pairs, each of said first column selection gate pairs operatively coupling between each of said first digit line pairs and said pair of bus lines, a plurality of second column selection gate pairs, each of said second column selection gate pairs operatively coupling between each of said second digit line pairs and said pair of bus lines, means for selecting one pair of said first column selection gate pairs and means for selecting one pair of said second column selection gate pairs.

23. A semiconductor memory device comprising a sense amplifier having a first input terminal and a second input terminal, a first digit line arranged on a first side of said sense amplifier, a second digit line arranged in parallel and adjacent to said first digit line, a third digit line arranged on a second and opposite side of said sense amplifier, a fourth digit line arranged in parallel and adjacent to said third digit line, a plurality of memory cells coupled to said digit lines, a first transfer gate arranged between said first digit line and said sense amplifier, a second transfer gate arranged between said second digit line and said sense amplifier, a third transfer gate arranged between said third digit line and sense amplifier, a fourth transfer gate arranged between said fourth digit line and said sense amplifier, means for receiving address signal, and means responsive to said address signal for enabling two of said first to fourth transfer gates thereby to electrically connect two of said first to fourth digit lines to said first and second input terminals of said sense amplifier.

24. The device according to claim 23, further comprising a pair of bus lines and an output bus line.

* * * * *

UNITED STATES PATENT AND TRADEMARK OFFICE
CERTIFICATE OF CORRECTION

PATENT NO. : 4,366,559
DATED : December 28, 1982
INVENTOR(S) : Tetsuo MISAIZU et al.

It is certified that error appears in the above-identified patent and that said Letters Patent is hereby corrected as shown below:

Col. 3, line 42, change "$\overline{D}2$ and $\overline{D}2$" to --D2 and $\overline{D}2$--;
line 50, change "$\overline{D}1$, $\overline{D}2$ and $\overline{D}3$" to --D1, D2 and D3--;
line 60, change "D1' $\overline{D}1$," to --D1 $\overline{D}1$,--.

Col. 4, line 56, change "intire" to --entire--;
line 63, change "capacit" to --capacitance--.

Col. 6, line 64, change "D1', D2' and D3'" to --$\overline{D}1'$, $\overline{D}2'$ and $\overline{D}3'$--
line 65, change "Mr31" to --$Mr_{31}$--.

Col. 8, line 15, change "$SF_1$" to --$SE_1$--;
line 43, change "$D_{out}$" (second occurrence) to --$\overline{D}_{out}$--;
line 50, change "$S_1$" (second occurrence) to --$\overline{S}_1$--;
line 53, change "$D_1$" (second occurrence) to --$\overline{D}_1$--.

Signed and Sealed this

Seventeenth Day of May 1983

[SEAL]

Attest:

DONALD J. QUIGG

Attesting Officer

Acting Commissioner of Patents and Trademarks